United States Patent
Mardilovich et al.

(10) Patent No.: US 9,410,260 B2
(45) Date of Patent: Aug. 9, 2016

(54) METHOD OF FORMING A NANO-STRUCTURE

(75) Inventors: Peter Mardilovich, Corvallis, OR (US); Qingqiao Wei, Corvallis, OR (US); Anthony M. Fuller, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 508 days.

(21) Appl. No.: 13/822,062

(22) PCT Filed: Oct. 21, 2010

(86) PCT No.: PCT/US2010/053588
§ 371 (c)(1),
(2), (4) Date: Mar. 11, 2013

(87) PCT Pub. No.: WO2012/054045
PCT Pub. Date: Apr. 26, 2012

(65) Prior Publication Data
US 2013/0175177 A1    Jul. 11, 2013

(51) Int. Cl.
*C25D 11/12*        (2006.01)
*C25D 11/34*        (2006.01)
(Continued)

(52) U.S. Cl.
CPC ............ *C25D 5/022* (2013.01); *B81C 1/00031* (2013.01); *C25D 11/045* (2013.01);
(Continued)

(58) Field of Classification Search
CPC ...... C25D 5/022; C25D 11/12; C25D 11/045; C25D 11/34; B81C 1/00031
USPC ........................................................ 205/136
See application file for complete search history.

(56) References Cited

U.S. PATENT DOCUMENTS

| | | |
|---|---|---|
| 5,581,091 A | 12/1996 | Moskovits et al. |
| 6,359,288 B1 | 3/2002 | Ying et al. |

(Continued)

FOREIGN PATENT DOCUMENTS

| | | |
|---|---|---|
| CA | 2137013 | 11/1994 |
| CN | 101255588 | 9/2008 |

(Continued)

OTHER PUBLICATIONS

Takahashi, H., et al., "Anodic film growth on Al layers and Ta—Al metal bilayers in citric acid electrolytes", Electrochimica Acta, 2005, p. 5065-5075.*

(Continued)

*Primary Examiner* — Keith Hendricks
*Assistant Examiner* — Stefanie S Wittenberg
(74) *Attorney, Agent, or Firm* — Dierker & Kavanaugh, P.C.

(57) ABSTRACT

A method of forming a nano-structure involves forming a multi-layered structure including an oxidizable material layer established on a substrate, and another oxidizable material layer established on the oxidizable material layer. The oxidizable material layer is an oxidizable material having an expansion coefficient, during oxidation, that is more than 1. Anodizing the other oxidizable material layer forms a porous anodic structure, and anodizing the oxidizable material layer forms a dense oxidized layer and nano-pillars which grow through the porous anodic structure into pores thereof. The porous structure is selectively removed to expose the nano-pillars. A surface (I) between the dense oxidized layer and a remaining portion of the oxidizable material layer is anodized to consume a substantially cone-shaped portion of the nano-pillars to form cylindrical nano-pillars.

12 Claims, 12 Drawing Sheets

(51) Int. Cl.
    *C25D 5/02*     (2006.01)
    *B81C 1/00*     (2006.01)
    *C25D 11/04*     (2006.01)
    *B82Y 30/00*     (2011.01)
    *B82Y 40/00*     (2011.01)
    *B82Y 20/00*     (2011.01)

(52) U.S. Cl.
    CPC .............. *C25D 11/12* (2013.01); *C25D 11/34* (2013.01); *B81B 2203/0361* (2013.01); *B81C 2201/0114* (2013.01); *B82Y 20/00* (2013.01); *B82Y 30/00* (2013.01); *B82Y 40/00* (2013.01)

(56) References Cited

U.S. PATENT DOCUMENTS

| | | |
|---|---|---|
| 6,610,463 B1 | 8/2003 | Ohkura et al. |
| 6,914,008 B2 | 7/2005 | Den et al. |
| 6,972,146 B2 | 12/2005 | Den et al. |
| 6,982,217 B2 | 1/2006 | Imada et al. |
| 7,079,250 B2 | 7/2006 | Mukai |
| 7,192,510 B2 | 3/2007 | Den et al. |
| 7,208,077 B1 | 4/2007 | Albers et al. |
| 7,265,375 B2 | 9/2007 | Zhang et al. |
| 7,267,859 B1 | 9/2007 | Rabin et al. |
| 7,322,871 B2 | 1/2008 | Lambertini et al. |
| 7,381,658 B2 | 6/2008 | Mardilovich et al. |
| 7,517,554 B2 | 4/2009 | Saito et al. |
| 7,569,905 B2 | 8/2009 | Hantschel et al. |
| 7,572,669 B2 | 8/2009 | Tuominen et al. |
| 7,594,982 B1 | 9/2009 | Roscheisen et al. |
| 7,686,885 B2 | 3/2010 | Ku et al. |
| 7,790,469 B2 | 9/2010 | Wang et al. |
| 2002/0090649 A1 | 7/2002 | Chan et al. |
| 2002/0121851 A1 | 9/2002 | Yasui et al. |
| 2004/0053167 A1 | 3/2004 | Hotta |
| 2004/0157358 A1 | 8/2004 | Hiramatsu et al. |
| 2005/0205903 A1 | 9/2005 | Hioki |
| 2005/0224360 A1 | 10/2005 | Varghese et al. |
| 2006/0024193 A1 | 2/2006 | Zhao et al. |
| 2006/0088993 A1 | 4/2006 | Zhang et al. |
| 2006/0138394 A1 | 6/2006 | Den et al. |
| 2006/0269797 A1 | 11/2006 | Lu et al. |
| 2007/0031639 A1 | 2/2007 | Hsu et al. |
| 2007/0054421 A1 | 3/2007 | Ueda et al. |
| 2007/0113530 A1 | 5/2007 | Morozov et al. |
| 2007/0118939 A1 | 5/2007 | Repetto et al. |
| 2007/0187238 A1 | 8/2007 | Whalen, III et al. |
| 2007/0229817 A1 | 10/2007 | Wang et al. |
| 2007/0235342 A1 | 10/2007 | Matsuo et al. |
| 2007/0264749 A1 | 11/2007 | Birkmeyer |
| 2008/0037173 A1* | 2/2008 | Saito ............... B82Y 10/00 360/135 |
| 2008/0047604 A1 | 2/2008 | Korevaar et al. |
| 2008/0116168 A1 | 5/2008 | Samper et al. |
| 2008/0218740 A1 | 9/2008 | Williams et al. |
| 2008/0223794 A1 | 9/2008 | Yamamichi et al. |
| 2008/0272421 A1 | 11/2008 | Bhat |
| 2008/0274359 A1 | 11/2008 | Lawrence et al. |
| 2009/0034122 A1 | 2/2009 | Ichihara et al. |
| 2009/0045720 A1 | 2/2009 | Lee et al. |
| 2009/0243584 A1 | 10/2009 | Zhang et al. |
| 2009/0266418 A1 | 10/2009 | Hu et al. |
| 2009/0297913 A1 | 12/2009 | Zhang et al. |
| 2009/0311516 A1 | 12/2009 | Wei |
| 2010/0033059 A1 | 2/2010 | Choi et al. |
| 2010/0047523 A1 | 2/2010 | Kim et al. |
| 2010/0066346 A1 | 3/2010 | Zhang et al. |
| 2010/0108132 A1 | 5/2010 | Tsakalakos et al. |
| 2010/0132772 A1 | 6/2010 | Asano et al. |
| 2010/0269894 A1 | 10/2010 | Misra et al. |
| 2010/0303722 A1 | 12/2010 | Jin et al. |
| 2011/0012103 A1 | 1/2011 | Yang et al. |
| 2011/0030382 A1 | 2/2011 | Eadon et al. |
| 2011/0174069 A1 | 7/2011 | Cornelius et al. |
| 2011/0240346 A1 | 10/2011 | Kang et al. |
| 2011/0284381 A1 | 11/2011 | Cabot et al. |
| 2011/0311800 A1 | 12/2011 | Yamashita et al. |
| 2013/0161614 A1 | 6/2013 | Tiwari et al. |

FOREIGN PATENT DOCUMENTS

| | | |
|---|---|---|
| JP | 05210245 | 8/1993 |
| JP | 08296060 | 11/1996 |
| JP | 10147898 | 6/1998 |
| JP | 2000035687 | 2/2000 |
| JP | 2003011099 | 1/2003 |
| JP | 2004098386 | 4/2004 |
| JP | 2004130171 | 4/2004 |
| JP | 2006520697 | 9/2006 |
| JP | 2006326723 | 12/2006 |
| JP | 2007098563 | 4/2007 |
| JP | 2008156705 | 7/2008 |
| JP | 2009037706 | 2/2009 |
| JP | 2009224146 | 10/2009 |
| KR | 100834896 | 4/2004 |
| WO | WO2009115230 | 9/2009 |

OTHER PUBLICATIONS

Mozalev, A., et al., "The growth and electrical transport properties of self-organized metal-oxide nanostructures formed by anodizing Ta—Al thin-film bilayers", Journal of Materials Science, 20, 2005, p. 6399-6407.*

Furneaux, et al., "The Formation of Controlled-Porosity Membranes From Anodically Oxidized Aluminum", Nature, vol. 337, Jan. 12, 1989, pp. 147-149.

Lin, G.-R. et al.; :Microwatt MOSLED Using SiOx With Buried Si Nanocrystals on Si Nano-Pillar Array; Journal of Lightwave Technology, Jun. 1, 2008, vol. 26 (11) pp. 1486-149 See figure 1.

Lin. G.-R. et al.; "Improving Carrier Transport and Light Emission in a Silicon-Nanocrystal Based MOS Light-Emitting Diode on Silicon Nanopillar Array"; Applied Physics Letters; Aug. 29, 2007, vol. 91, pp. 093122-1 to -3.

Mardilovich et al., "Electrochemical Fabrication of Nanodimensional Multilayer Films", Nano Letters (2005), vol. 5, No. 10, pp. 1899-1904.

Mardilovich, et al. "Hybrid Micromachining and Surface Microstructuring of Alumina Ceramic", Proc. Electrochem. Society, 2000-19, pp. 33-42.

Masuda et al., "Highly Ordered Nanochannel-Array Architecture in Anodic Alumina", Appl. Phys. Lett. 71 (19), Nov. 10, 1997, pp. 2770-2772.

Mozalev et al., "Nucleation and Growth of The Nanostructured Anodic Oxides on Tantalum and Niobium Under The Porous Alumina Film", Electrochimica Acta 48 (2003), pp. 3155-3170.

Mozalev et al., "Structure, Morphology, and Dielectric Properties of Nanocomposite Oxide Films Formed by Anodizing of Sputter-Deposited Ta—Al Bilayers", J of Electrochem Society 151 (11) 2004 pp. F257-F268.

Fang, et al.; "Nanoimprinted SU-8 Nanopillars and Hierarchically Branched Nanowires by Anodic Aluminum Oxide Templates and Their Optical Properties"; Conference Proceeding of Micro/Nano Symposium (UGIM), 2010 ISth Biennial.

Kuo et al.; "Sub-10nm Fabrication of Large Area Periodic Nanopillars", Mat. Res. Soc. Symp. Proc. vol. EXS-2 (2004), pp. M511.1-11.3.

Kwon et al.; "Simple Fabrication Method of Hierarchical Nano-Pillars Using Aluminum Anodizing Processes"; Current Applied Physics, Mar. 13, 2009, vol. 9, pp. e8I-e85.

Lee, et al.; "Fabrication of Polymer Micro/Nano-Hybrid Lens Array By Microstructured Anodic Aluminum Oxide (AAO) Mold"; Microelectronic Engineering; Dec. 9, 2008. vol. 86, pp. 857-860.

Kiether, William Jay, "Application of Sculptured Thin Film Technology to Metal Oxide Gas Sensors," doctoral dissertation, 2007. Retrieved from http://repository.lib.ncsu.edu/ir/handle/1840.16/3698.

* cited by examiner

Aluminum Anodization

Complete Aluminum Anodization and Initial Tantalum Anodization

Continued Tantalum Anodization

Continued Tantalum Anodization To Fig 1E

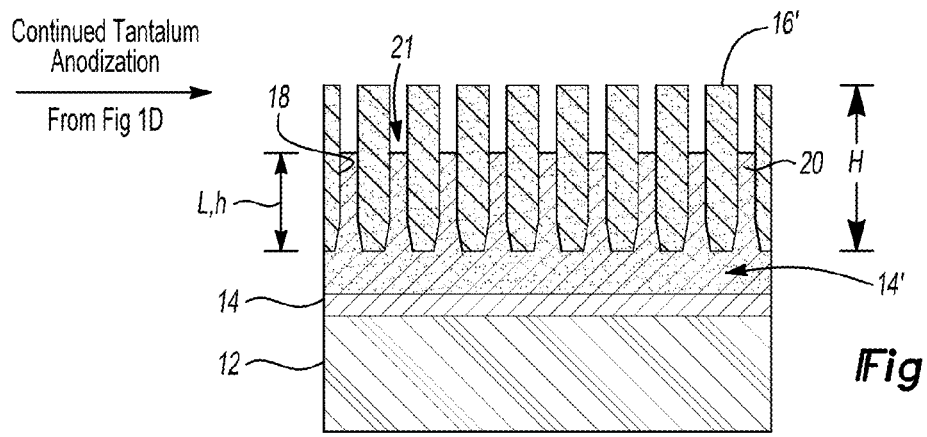
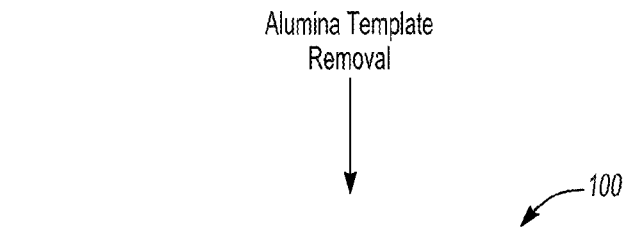
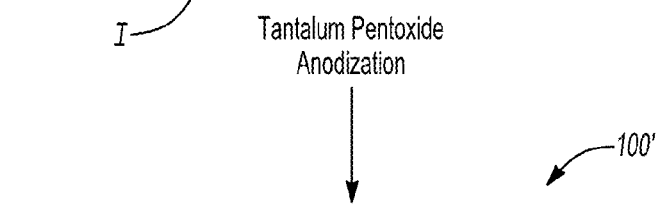
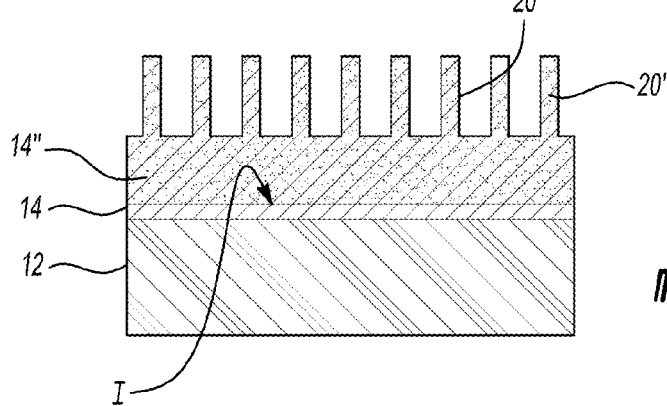

METHOD OF FORMING A NANO-STRUCTURE

BACKGROUND

The present disclosure relates generally to methods of forming a nano-structure.

Porous anodic oxide structures may be used in a variety of applications including, but not limited to, micro- and nano-electronics (such as, e.g., in planarized aluminum interconnections, precision thin-film resistors, thin-film capacitors, and nano-structured field-emission cathodes), electrostatic and thermo-activated switching devices, LC high-frequency oscillators, AC amplifiers, triggers and other logic vacuum integrated circuits (VICs), gas micro- and nano-sensors, micro- and nano-channel plates, mesoscopic engines, wavelength-sensitive filters, reflective and absorbing surfaces, membranes, nozzles, precision apertures, and/or like. These anodic oxide structures may also include one or more arrays of nano-pores that are used, for example, to form nano-structures having one or more arrays of nano-pillars formed on and supported by a substrate. Fabrication processes for forming these nano-structures often dictate, at least in part, the geometry and/or chemistry of the individual nano-pillars, as well as the population density of arrays of the nano-pillars in the structure. Typically, each nano-pillar has a cylindrical-shaped portion at one end thereof, and a cone-shaped portion at another end thereof. The inconsistent shape along the length of the individual nano-pillars may, in some instances, hinder the formation of a substantially uniform nano-structure.

BRIEF DESCRIPTION OF THE DRAWINGS

Features and advantages of embodiments of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIGS. 1A through 1G together schematically depict an embodiment of a method of forming an embodiment of a nano-structure;

FIGS. 7A through 7D show, in sequence, the effect of continued anodization of the tantalum pentoxide nano-pillars after alumina template removal has been performed;

DETAILED DESCRIPTION

Figure 1A:
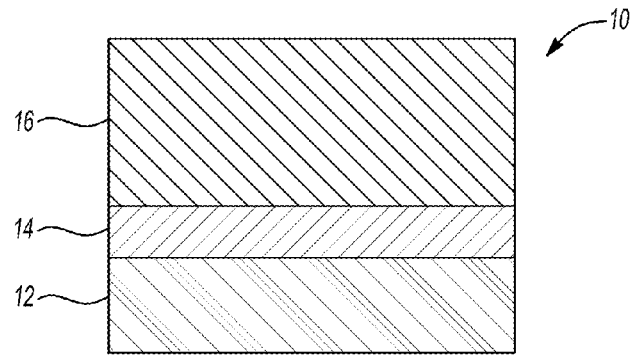

Embodiment(s) of the method disclosed herein may be used to form a nano-structure including cylindrical nano-pillars. As used herein, a "cylindrical nano-pillar" is a nano-pillar having a geometry with a substantially uniform diameter throughout its length. A "substantially uniform diameter" refers to a diameter of the cylindrical nano-pillar that deviates minimally (e.g., ±10% from a mean diameter) throughout the length of the nano-pillar. As examples, a nano-pillar having a mean diameter of about 20 nm may have diameters ranging from about 18 nm to about 22 nm across the pillar's length and a nano-pillar having a mean diameter of about 100 nm may have diameters ranging from about 90 nm to about 110 nm across the pillar's length. In other embodiments, the minimal deviation of the diameter throughout the length of a nano-pillar may be ±5% from a mean diameter or ±2% from a mean diameter. In one embodiment, a single cylindrical nano-pillar may have multiple different diameters (i.e., the perimeter is not perfectly round), but each respective diameter is substantially uniform throughout the length of the nano-pillar (see, e.g., FIG. 7D). In some cases, a cylindrical nano-pillar may be referred as a nano-cylinder.

The uniform and reproducible cylindrical geometry of the nano-pillars advantageously enables one to impart unique optical properties to surfaces of these nano-pillars so that a nano-structure including these nano-pillars may be used in various selected applications. In nano-optics, photonic crystals with z to −z mirror symmetry (i.e., reflection with respect to a plane perpendicular to the pillars and cutting through their middle) have the additional property of weak mixing of the Transverse Electric (TE) and Transverse Magnetic (TM) propagation modes. In an ideally mirror-symmetric structure, the mixing would be exactly zero. It is easier to make a 2D photonic crystal with a gap just for one mode (TE or TM) than for both modes at once. If the modes do not mix, TE remains TE and TM remains TM. Thus, in principle, a TM-only waveguide or a TE-only waveguide can be created, and the losses will be minimal. However, if cylindrical nano-pillars are not used, TE will be converted into TM and vice versa, and the losses will be very large. As such, losses will be reduced if the cylindrical nano-pillars disclosed herein are utilized in nano-optics. In another embodiment, the cylindrical nano-pillars may be used in chip-scale electrophoresis. It is believed that the cylindrical nano-pillars will produce a flatter flow profile than less symmetrical pillars.

An example of a nano-structure formed by embodiment(s) of the method disclosed herein is identified by reference numeral 100' in FIG. 1G. Briefly, this nano-structure 100' is an anodic oxide nano-structure including an oxidizable material layer 14 disposed on a substrate 12, and an oxide layer 14" formed on the oxidizable material layer 14. The nano-structure 100' further includes cylindrical nano-pillars 20' formed from the oxidizable material layer 14 and positioned on the oxide layer 14".

An embodiment of the method of forming the nano-structure 100' is schematically depicted in FIGS. 1A through 1G, which may be referred to herein as the FIG. 1 series. Referring now to FIG. 1A, the method of forming the nano-structure 100 includes forming a multi-layered structure 10 that contains i) an oxidizable material layer 14 established on a substrate 12, and ii) another oxidizable material layer 16 established on the oxidizable material layer 14. The multi-layered structure 10 may be formed, for example, by depositing an oxidizable material on the substrate 12 to form the oxidizable material layer 14 having a thickness, and then depositing the other oxidizable material on the oxidizable material layer 14 to form the other oxidizable material layer 16, which also has a thickness. In one embodiment, the oxidizable material layer 14 is formed of a metal or metal alloy that forms a dense oxide after electrochemical oxidation, and the other oxidizable material layer 16 is formed of a metal or metal alloy that forms a porous oxide after electrochemical oxidation. Examples of suitable materials will be discussed further hereinbelow.

The layers 14, 16 have respective thicknesses that may be different or may be substantially the same. In one embodiment, the thickness of each of the layers 14, 16 is in the nanometer range. The layer 14 may have any suitable thickness that will produce (during electrochemical oxidation) enough oxide to form the nano-pillars 20 and to perform planarization of a cone-shaped portion of the nano-pillars 20 to form nano-pillars 20' and oxide structure 14".

In an example, the thickness of the oxide grown from the layer 14 (i.e., the structure 14" and the nano-pillars 20') is determined by multiplying the anodization voltage by an anodization coefficient (i.e., the number of nanometers that the oxide grows per one volt of anodization voltage). For instance, for a Ta layer 14, about 1.8 nm of $Ta_2O_5$ grows per volt of anodization voltage applied to the layer 14 to form a dense $Ta_2O_5$ film. In another instance, from about 1.3 nm to about 1.8 nm of $Ta_2O_5$ grows per volt of anodization voltage applied to the layer 14 to form nano-pillars with an underlying dense $Ta_2O_5$ film. In the latter instance (i.e., when there is a dense $Ta_2O_5$ film beneath the nano-pillars), the anodization coefficient depends, at least, on the diameter of the pores in the template 16', the overall porosity of the template 16', the nature of the electrolyte used for Ta anodization, and the current density during Ta anodization.

The thickness of the Ta layer 14 should be thick enough to produce a $Ta_2O_5$ layer having any desired thickness and, in some cases, to maintain some of the Ta layer 14 on the substrate 12 underneath the formed nano-pillars 20 and the dense portion of $Ta_2O_5$. For example, to produce a dense $Ta_2O_5$ layer with no nano-pillars, the total thickness of the Ta layer 14 may be calculated by i) multiplying the completed anodization voltage (i.e., the specific voltage at which the oxide thickness reaches a steady state value) by 1.8 nm of $Ta_2O_5$ growth per volt to determine the thickness of $Ta_2O_5$ that grows, and ii) then dividing that number by the expansion coefficient (i.e., the ratio of $Ta_2O_5$ to consumed Ta), which is 2.3. For instance, if an anodization voltage of 200 V is used for completing the Ta anodization and 1.8 nm of $Ta_2O_5$ grows per volt (which produces about 360 nm of $Ta_2O_5$), and the expansion coefficient is 2.3, then the thickness of the Ta layer 14 is about 160 nm. In instances where nano-pillars, with an underlying dense $Ta_2O_5$ film, are grown from the Ta layer 14, the thickness of the Ta layer 14 is based, at least in part, on the volume of $Ta_2O_5$ (which depends, at least in part, on the fraction of pillars in the entire stack, as well as their filling factor, i.e., pillar density) and the anodization coefficient (which depends, at least in part, on the electrolyte used and the anodization conditions, and is from about 1.3 nm to about 1.8 nm per volt for tantalum). The following is an example of how the Ta layer thickness is calculated when it is desirable to form both nano-pillars and the underlying dense layer. In this example, the nano-pillars with an underlying dense $Ta_2O_5$ layer are fabricated at 200 V. The height of pillars is 240 nm and the dense layer is 50 nm. The anodization coefficient is 1.45 nm/V. The pillar filling factor (or pillars density) is around 25%. In this example, nano-pillars of 240 nm are equivalent to 60 nm of dense $Ta_2O_5$, and thus there is a total of 110 nm of dense $Ta_2O_5$ that will be formed. In order to generate 110 nm of dense $Ta_2O_5$, at least about 50 nm of Ta is used in layer 14 (i.e., 110/2.3≈47.8). In other examples, these calculations may be performed assuming that the overall density of the nano-pillars is about 90%.

In the embodiments disclosed herein, the thickness of layer 14" (which includes the dense $Ta_2O_5$ layer formed after the final anodization step) may be calculated as follows: thickness of layer 14"=1.8 nm×anodization voltage at the final step. Furthermore, the diameter of the biggest part of the cone-shaped portion of the initially formed nano-pillars 20 is about 3*d (where d=pore or pillar diameter, see FIG. 2B). 3*d is approximately equal to the cell diameter (D, again see FIG. 2B), as such, the biggest part of the cone-shaped portion cannot be bigger than cell 17. Still further, approximately 2*d (nm) of pillar height is engulfed in order to form the nano-pillars 20'. For example, if nano-pillars 20 are 30 nm in diameter, but have a cone-shaped portion having a maximum diameter of about 90 nm and a height of about 60 nm, covering about 60 nm of the bottom of pillar (in the Z-direction) will consume the cone-shaped portion of the pillars. Yet further, it is believed that in order to consume or engulf 1 nm of pillar, about 2.7 nm of dense $Ta_2O_5$ should be present. Using the previous information, the voltage that should be used in the final stage of anodization (i.e., after the alumina template is removed) in order to transform the nano-pillars 20 into nano-pillars 20' can be predicted. The voltage may be calculated by: 2d*2.7/1.8. This is equal to 3d. As such, for pillars with 30 nm diameters, the voltage used in the final stage of anodization should be up to 90 V to achieve the desired cylindrical shape.

The thickness of the layer 16, on the other hand, should be thick enough to form a template 16' (see FIG. 1B) that has a height that is taller than the height of the nano-pillars 20 to be grown from the layer 14. In one example, the layer 16 has a thickness of 100 nm or less. In another example, the layer 16 has a thickness of 50 nm or less. In an example, the thickness of the template 16' is about the thickness of the layer 16 times the expansion coefficient (e.g., about 1.3, which is the ratio between the thickness of the porous anodic alumina and the thickness of the aluminum layer 16 consumed).

In an example, each of the layers 14, 16 are planar (e.g., are substantially flat and include, if any, a minimal amount of irregularities). In another example, one or more of the layers 15, 16 are non-planar. In this example, the non-planar layer(s) 14, 16 may also include a special morphology, features, structures, and/or the like that are etched into or incorporated into the layers 14, 16. The planar or non-planar layers 14, 16 may be deposited on a planar or non-planar substrate 12, which will be described further below.

The deposition of the oxidizable material on the substrate 12 and the deposition of the other oxidizable material on the oxidizable material layer 14 may be accomplished using any suitable deposition technique known in the art. Some examples of suitable deposition techniques include physical vapor deposition (PVD) (such as, e.g., sputtering, thermal evaporation, and/or pulsed laser deposition), atomic layer deposition (ALD), or, in some instances, chemical vapor deposition (CVD).

The substrate 12 upon which the oxidizable material is deposited to form the layer 14 may be chosen based, at least in part, on the application for which the nano-structure 100' will ultimately be used. If, for example, the nano-structure 100' is to be used for semiconductor applications, the substrate 12 may be chosen from suitable support structures for semiconductors such as, e.g., a substantially planar silicon wafer. By "substantially planar", it is meant that the surface is flat but may contain some irregularities. In this example, the substrate 12 may have formed thereon a layer of insulating material (not shown) such as, e.g., silicon oxide or silicon nitride. The substrate 12 may also or otherwise be a non-planar structure, e.g., the substrate may have a special morphology etched on or fabricated into the substrate 12. The substrate 12 may also be chosen from other materials such as, e.g., glass, quartz, alumina, stainless steel, plastic, and/or the like, and/or combinations thereof. In instances where the nano-structure 100' is used as a filter, the substrate 12 may be chosen from a silicon wafer with a thermally grown oxide (TOX) top layer, such as TOX/Si or $SiO_2$/Si. In an example, TOX/Si may be formed by oxidizing Si at a high temperature (i.e., from about 800° C. to about 1200° C.) using water vapor (steam) or molecular oxygen as the oxidant. In other words, TOX/Si may be formed via dry or wet oxidation, and the TOX/Si oxide layer may be referred to as a high temperature oxide layer. In some cases, a dry oxygen atmosphere produces a higher quality $SiO_2$, but the process itself is relatively slow. For thicker TOX/Si layers (i.e., a thickness of about 0.5 µm to about 4 µm or more), oxidation of the Si in a wet oxygen atmosphere is desirable. Other examples of the substrate 12 include SiN, SiC, TEOS (which is $SiO_2$, but is prepared using a chemical vapor deposition (CVD) method from tetra-ethyloxy-silane (i.e., tetra-ethyl-ortho-silicate)), or the like.

The oxidizable material for the oxidizable material layer 14 is a conductor and may be chosen from a material that i) can be electrochemically oxidized and ii) has an expansion coefficient, during oxidation, that is more than 1. In some cases, the oxidizable material for the layer 14 may also or otherwise be thermally oxidized. Without being bound to any theory, it is believed that an expansion coefficient of more than 1 allows the oxidizable material to squeeze into the pores 18 of the template 16' (which will be described in further detail below). It is further believed that the height of the nano-pillars 20 that are formed may, at least partially, be based on the expansion coefficient of the material in the layer 14. In an example, a nano-pillar 20 height ranging from about 10 nm to 1000 nm may be achieved when the expansion coefficient of the oxidizable material in layer 14 is more than 1. It is to be understood that the height of the nano-pillars 20 and the thickness of structure 14" may also be based, at least in part, on other factors, including the anodization voltages used during the respective anodization of layers 16 and 14. Further details about the height of the nano-pillars 20 will be described below. As mentioned above, in one example, the expansion coefficient of the oxidizable material for the layer 14 is more than 1. Some examples of suitable oxidizable materials include tantalum (which has an expansion coefficient for thermal oxidation of 2.3, as mentioned above), titanium (which has an expansion coefficient for thermal oxidation of 1.7), niobium (which has an expansion coefficient for thermal oxidation of 2.7), and tungsten (which has an expansion coefficient for thermal oxidation of 3.3). It is to be understood that the expansion coefficient for thermal oxidation for each of the foregoing materials is substantially the same as that for electrochemical oxidation so long as the phase of each of these materials during oxidation is the same.

The other oxidizable material for the other oxidizable material layer 16 is also a conductor, but is chosen from a metal or metal alloy that, after electrochemical oxidation, produces a porous oxide. One example of the other oxidizable material includes aluminum or aluminum alloys, such as an aluminum alloy having aluminum as the main component. It is further to be understood that silicon, titanium, tantalum, niobium, and tungsten in the aluminum alloy may be present in small quantities such as, e.g., up to about 5%. Another example of the other oxidizable material includes titanium, where such material may be oxidized using an appropriate electrolyte and anodization conditions to ultimately produce a porous oxide. In still another embodiment, the material layer 16 may be formed of silicon. When silicon is selected, field assisted anisotropic etching of silicon may take place in the presence of an HF-based electrolyte to create a porous silicon template, which is then oxidized to form a porous silicon dioxide template. It is believed that the layer 14 can still be anodized in the desirable manner when porous silicon dioxide is used as the template 16'. In yet another example, it is believed that the silicon may be transformed into $Si_xN_y$, which is not an oxide but is a dielectric and may be used as a template for $Ta_2O_5$ nano-pillar growth.

The oxidizable material forming the oxidizable material layer 14 and the other oxidizable material forming the other oxidizable material layer 16 are substantially pure. As used herein, the term "substantially pure" refers to a material (such as a metal or a metal alloy) having a minimal amount, if any, impurities present therein. In an example, a substantially pure metal may be one that includes at least 95% of the metal. In some cases the substantially pure metal includes about 100% metal, and thus practically no impurities. In these cases, the metal may be referred to as a substantially pure metal, a pure metal, or just a metal. In an example, the substantially pure metal has at least about a 99.9% (e.g., often expressed as 3N), and in some cases at least about 99.99% purity (e.g., often expressed as 4N). It is to be understood that, in some instances, the oxidizable material and/or the other oxidizable material may be a metal alloy.

For purposes of illustration, the method depicted in the FIG. 1 series will now be described using tantalum as the oxidizable material in the oxidizable material layer 14, and aluminum as the oxidizable material in the other oxidizable material layer 16. As such, in reference to the FIG. 1 series, the layer 14 will be referred to as the tantalum layer 14, and layer 16 will be referred to as the aluminum layer 16. However, as previously noted, the layers 14 and 16 are not to be construed as being limited to being formed of tantalum and aluminum, respectively, but can be any of the oxidizable materials listed herein for the respective layers 14, 16.

Figure 1B:
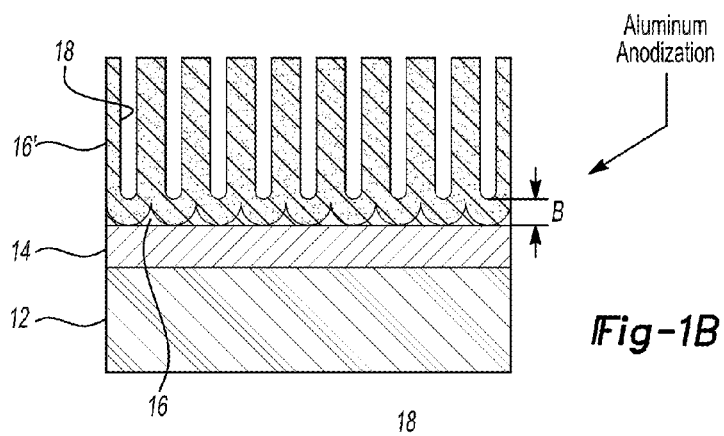

After the multi-layered structure 10 is formed, a template 16' is formed out of the aluminum layer 16, as shown in FIG. 1B. In one embodiment, the template 16' is formed by anodizing the aluminum layer 16. Anodization refers to the oxidation of less than the entire thickness of the layer being anodized. It is to be understood that enough of the aluminum layer 16 is anodized to form the desired template 16', which includes a plurality of pores 18 defined therein and a barrier layer B of alumina that defines the bottom of each pore 18. As illustrated in FIG. 1B, after template 16' formation, there is some remaining non-anodized aluminum 16 (e.g., the pyramids of aluminum 16).

Referring back to FIG. 1B, anodization of the aluminum layer 16 to form the template 16' may be accomplished by employing the aluminum layer 16 as the anode of an electrolytic cell and selecting at least one of $H_2SO_4$ (sulfuric acid), $H_3PO_4$ (phosphoric acid), $C_2H_2O_4$ (oxalic acid), or $H_2CrO_4$ (chromic acid) as the electrolyte. These electrolytes form porous alumina rather than dense alumina. The electrolyte may be present in a water based solution. In one embodiment where the electrolyte is oxalic acid ($C_2H_2O_4$), the electrolyte may be present, in solution with water, at a wt % ranging from about 1 wt % to about 5 wt %. In another embodiment where the electrolyte is $H_2SO_4$, the electrolyte may be present, in solution with water, at a vol % ranging from about 5 vol % to about 40 vol %. In some instances, certain additives (e.g., an alcohol, a surfactant, etc.) may also be added to the electrolyte solution. It is to be understood that the concentration of electrolyte in solution and the other conditions may vary as long as they are suitable for porous anodization (i.e., the formation of the porous template 16'). Any suitable cathode may be used, for example, aluminum or platinum (e.g., foil or mesh). A suitable amount of voltage and current is then applied to the electrolytic cell for an amount of time to anodize some of the aluminum layer 16 (i.e., where the anodized portion of the aluminum layer 16 is oxidized). The anodization of the aluminum layer 16 forms porous anodic aluminum oxide (i.e., porous anodic alumina), and allows the alumina to grow to a desired thickness.

The porous template 16' is shown in FIG. 1B. It is to be understood that the pores 18 at this point in the process do not extend through to and expose the underlying tantalum layer 14. The size of the pores 18 formed during anodization may be controlled through the selection of the electrolyte and the anodization conditions. For instance, for an alumina template, the diameter D of a cell 17 is about 2.8 nm per volt (e.g., when Al is used for layer 16), and the diameter d of the pore 18 depends on the electrolyte and the current density. In one embodiment, the diameter d of the pore 18 is proportional to the voltage used. The ratio of the cell diameter and the pore diameter (D/d) is, for example, 3.3 for a $H_2CrO_4$ electrolyte, 4.9 for a $H_2SO_4$ electrolyte, 3.0 for a $H_2C_2O_4$ electrolyte, and between 1.7 and 2.1 for a $H_3PO_4$ electrolyte. As examples, pores of the following sizes may be obtained using the following electrolytes: pores having about 20 nm diameters may be obtained using $H_2SO_4$ as the electrolyte, pores having about 40 nm diameters may be obtained using $C_2H_2O_4$ as the electrolyte, and pores having about 120 nm may be obtained using $H_3PO_4$ as the electrolyte. The size of the pores 18 may also be controlled via anisotropic etching after anodization is complete. This etching process further defines the already formed pores 18, and in many instances increases the diameter of the formed pores 18. Anisotropic etching may be performed using diluted phosphoric acid (5 vol. %), a solution of $H_2SO_4$ (20 vol. %), or a diluted form of a hydroxide such as, e.g., NaOH or KOH. The time for etching may vary, depending, at least in part, upon the desirable average diameter for the final pores 18. In an embodiment, the anisotropic etching time ranges from about 1 minute to about 45 minutes in instances where anisotropic etching is performed using a diluted phosphoric acid (5 vol. %). The temperature for etching may also depend upon the process and etchant used. In one embodiment, the etchant temperature ranges from about 0° C. to about 100° C. depending, at least in part, on the type of etchant used. In an example, the etchant temperature ranges from about 20° C. to about 40° C., for example, when a diluted phosphoric acid etchant is used.

In another embodiment, prior to performing layer 16 anodization, the method includes patterning the aluminum layer 16. Patterning may be accomplished via any suitable technique, and is used to perform localized anodization of the aluminum layer 16. Any standard photolithography method may be utilized. One example of patterning with standard photolithography includes depositing a hard mask material (e.g., $Si_xN_y$, such as SiN or $Si_3N_4$) on the aluminum layer 16, and then using a photoresist to pattern the $Si_xN_y$ material to allow localized exposure of aluminum. In an example, the mask is patterned to expose portion(s) of the aluminum to the electrolyte. In some cases, the aluminum may also be patterned and etched to produce clusters of aluminum (i.e., formed when areas of aluminum are etched, but the Ta is still present). In other cases, aluminum and tantalum are patterned and etched to produce clusters of aluminum/tantalum. In this example, the interface formed between the mask and the aluminum layer 16 is robust, which advantageously prevents separation of the layers during anodization. In one embodiment, the areas that remain exposed once the mask and photoresist are in position are subject to local anodization. The aluminum layer exposed via the patterned mask or the patterned aluminum layer (not shown) is then locally anodized, for example, by employing the exposed or patterned aluminum layer as the anode of an electrolytic cell, and employing any suitable cathode, such as aluminum (having a 99.99% purity) and/or platinum (foil or mesh). The electrolyte may be selected from any electrolyte that will suitably allow the formation of porous alumina. Some examples of the electrolyte include solutions of $H_2SO_4$, $H_3PO_4$, $H_2C_2O_4$, and $H_2CrO_4$. A suitable voltage and current is then applied to the electrolytic cell for an amount of time to completely or fully anodize the patterned aluminum layer (i.e., where the entire thickness of the patterned aluminum layer is oxidized).

Figure 3:
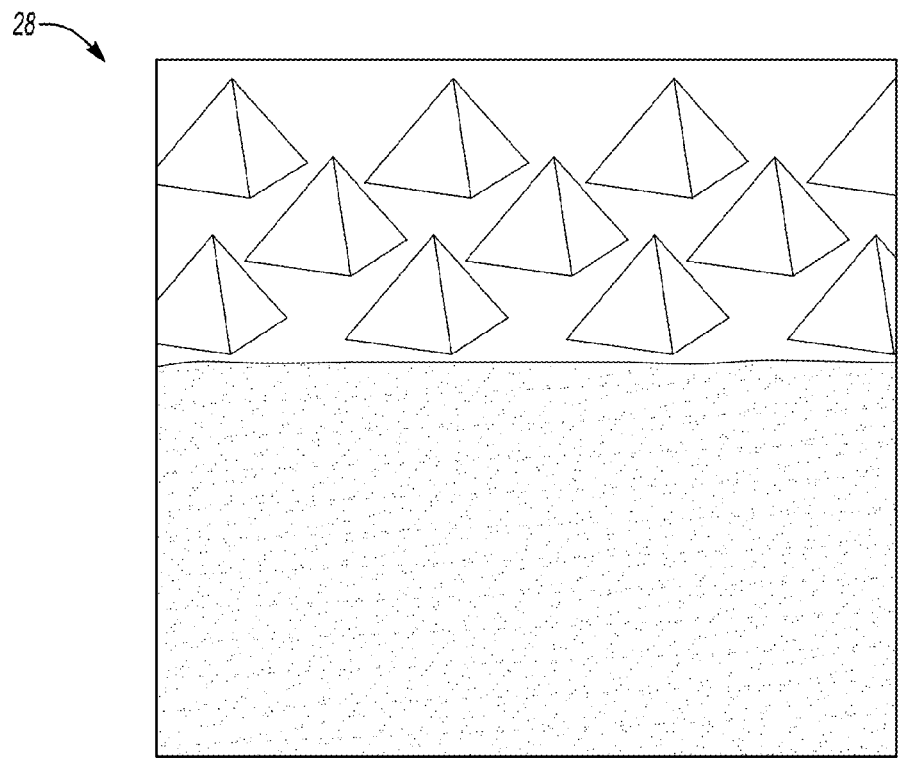
FIG. 3 is a schematic side view of an example of a master that can be used to form an embodiment of an anodic alumina template.

In still another embodiment, the aluminum layer 16 may be patterned by transferring a pattern from a master (see, e.g., reference numeral 28 in FIG. 3) onto the aluminum layer 16 (which may be annealed prior to the transfer). In one example, a SiC master having a surface with hexagonally-ordered array of convexes may be pressed against aluminum layer 16 to form an array of concaves on the surface of the aluminum layer 16. The aluminum layer 16 may thereafter be anodized via the method described above using a constant voltage (i.e., a potentiostatic regime). The dimensions of the master 28 are chosen for a specific anodic alumina cell diameter D, and as such, that master 28 is used to obtain a single cell diameter D and a single pore diameter d (noting that small differences may be expected for pore diameter d when different electrolytes and/or anodization voltages are used). This method forms a highly hexagonally-ordered array of pores (having uniform diameters) in the anodic alumina.

The combination of patterning and anodization forms a porous anodic alumina template 16' with specific dimensions (e.g., a hexagonally-ordered array of pores). The template 16' formed via this embodiment of the method may also be anisotropically etched as previously described to further define the pores 18.

In one example, the anodization of the aluminum layer 16 may be accomplished via a potentiostatic regime, whereby a constant anodization voltage is applied. Due at least in part to the pore diameter being proportional to voltage, anodization using a constant voltage produces pores having a substantially constant diameter from top to bottom. In another example, the anodization may be accomplished via a galvanostatic regime, whereby a constant current density is applied, and thus a constant rate of anodization is achieved. In this example, the voltage may vary during the anodization, which produces pores having a varying diameter from top to bottom.

Figure 2A:
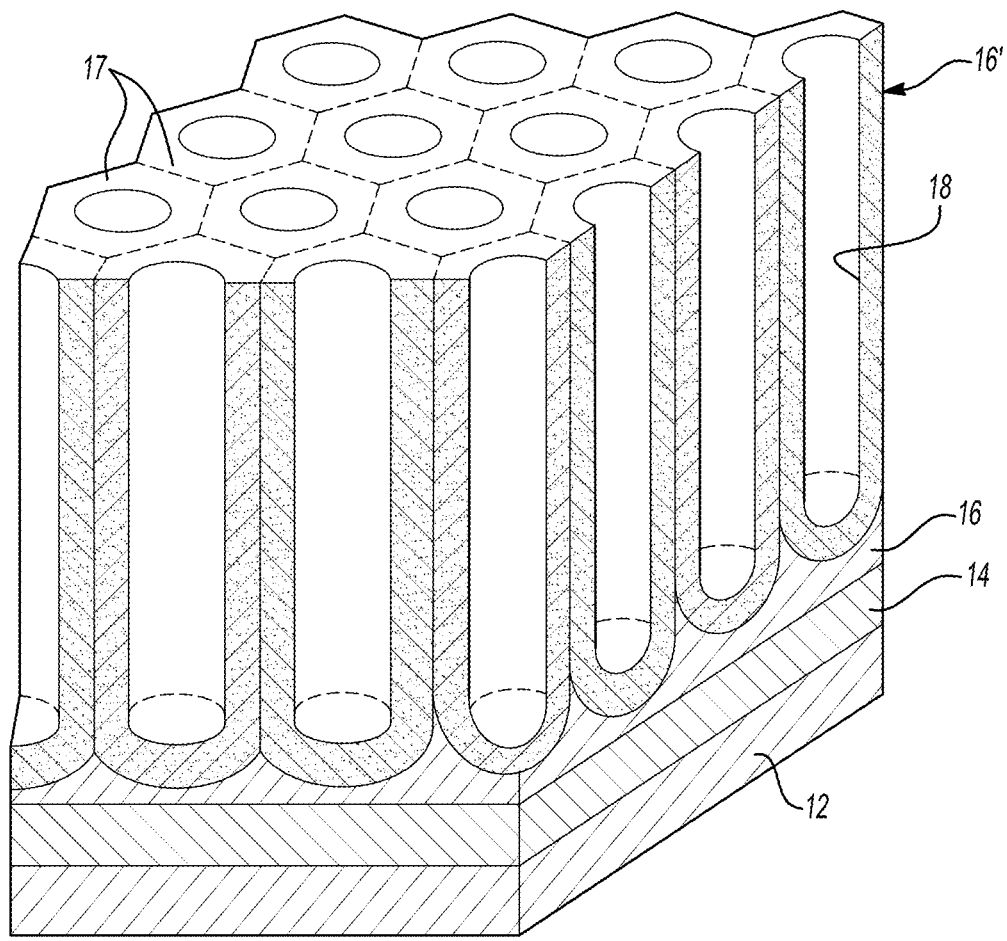
FIG. 2A is a schematic three-dimensional representation of the porous anodic alumina template prior to complete anodization of the aluminum.

The anodic alumina template 16' is schematically shown in FIG. 1B (cross-sectional view). Another example of the anodic alumina template 16' (where a portion of the aluminum layer 16 remains) is shown in FIGS. 2A (perspective view), 2B (top view), and 2C (an SEM image of a cross section of the template 16') where the template 16' includes a plurality of cells 17 (see FIGS. 2A and 2B) each having a pore 18 defined therein. It is to be understood that the sample shown in the SEM image of FIG. 2C was anisotropically etched for 30 minutes to increase the diameter of the pores 18. In an example, each of the pores 18 defined in the template 16' is oriented substantially normal to the substrate 12 surface.

Figure 1C:
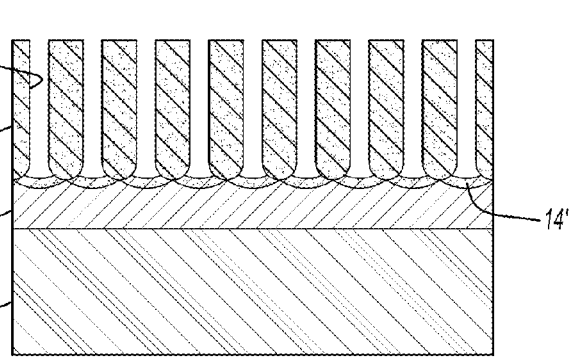

Referring now to FIG. 1C, either anodization is continued or another anodization current and voltage is applied to initiate a plurality of steps that lead to the complete anodization of the remaining aluminum layer 16 and the formation of tantalum pentoxide nano-pillars 20 (see FIG. 1E).

The anodization process that oxidizes remaining aluminum 16 and oxidizes the tantalum 14 may be accomplished, for example, using the same process described above for initial anodization of the aluminum layer 16 (to form the template 16'). In one embodiment, the anodization of remaining portions of the aluminum layer 16 and the layer 14 is accomplished by employing the tantalum layer 14 as the anode of an electrolytic cell and employing platinum, stainless steel, or any other appropriate material as the cathode, and applying a suitable anodization voltage and/or current density to initiate the various processes described herein.

It is to be understood that the remaining aluminum layer 16 (e.g., aluminum fragments located between alumina cells 17 of the template 16') may become anodized via a variety of methods. When the remaining aluminum layer 16 is anodized, it becomes alumina and essentially becomes part of the barrier layer B. This alumina barrier layer B is a dielectric layer between the electrolyte and the metal (in this case, tantalum).

It is to be understood that the remaining aluminum layer 16 can be anodized using the same electrolyte used to form the template 16', or can be anodized using another electrolyte that results in the formation of dense (as opposed to porous) alumina. When the electrolyte used to form the template 16' is used to oxidize the remaining aluminum layer 16, the anodization process used for the aluminum layer 16 may simply be continued until complete aluminum anodization is achieved and the tantalum interface is reached (as indicated, for e.g., by the change in current density). In the embodiment where the electrolyte used to complete aluminum anodization is the same electrolyte that forms the porous template 16', it is believed that the barrier layer B making up the bottom of the pores 18 is etched away by field assisted dissolving. This dissolution opens up the pores 18 to enable growth of tantalum pentoxide nano-pillars 20 therein. In this embodiment, tantalum anodization may be performed using the same electrolyte (i.e., the electrolyte that forms the porous template) or another electrolyte.

When the same electrolyte is used for template 16' formation and tantalum layer 14 anodization, the anodization process is continued in order to begin the oxidation of the tantalum layer 14. As shown in FIGS. 1B and 1C, in this embodiment, complete aluminum anodization (i.e., formation of the template 16', oxidation of the remaining aluminum 16, and dissolution of the bottom of each pore 18) and tantalum anodization may take place in the same electrolyte (e.g., oxalic acid). This electrolyte will form the template 16', anodize remaining aluminum 16, will dissolve alumina from the bottom of the pores 18, and will subsequently grow a dense oxide from the layer 14. This advantageously enables the barrier layer B at the bottom of each pore 18 to dissolve and the $Ta_2O_5$ to be generated at the same time, thus keeping the overall thickness of the oxide such that it corresponds to the applied voltage.

In another embodiment, complete aluminum anodization is performed in the electrolyte that results in the porous alumina template 16' with open pores 18 (e.g., oxalic acid), and then the electrolyte may be switched to form the dense tantalum pentoxide. In this embodiment, the electrolyte used during the subsequent anodization is selected from citric acid ($C_6H_8O_7$), boric acid ($H_3BO_3$), ammonium pentaborate (($NH_4$)$_2B_{10}O_{16} \times 8H_2O$), ammonium tartrate ($H_4NO_2CCH(OH)CH(OH)CO_2NH_4$), mixtures thereof, or another suitable electrolyte. This electrolyte will form the dense tantalum pentoxide layer 14' that will ultimately grow to form the nano-pillars 20.

In still another embodiment (not shown in figures), after the template 16' is formed and some aluminum layer 16 remains, another electrolyte (i.e., an electrolyte that results in the formation of a dense, rather than porous, alumina) is used to oxidize the remaining aluminum layer 16 and to grow the $Ta_2O_5$. In this embodiment, the electrolyte solution will be switched, and anodization of the remaining aluminum layer 16 and of the tantalum layer 14 will take place in this other electrolyte (examples of which include citric acid ($C_6H_8O_7$), boric acid ($H_3BO_3$), ammonium pentaborate (($NH_4$)$_2B_{10}O_{16} \times 8H_2O$), ammonium tartrate ($H_4NO_2CCH(OH)CH(OH)CO_2NH_4$), and/or another suitable electrolyte). In this embodiment, the anodization of the remaining aluminum layer 16 will form a dense alumina that increases the thickness of the barrier layer B, but will not open up the pores 18. Without being bound to any theory, it is believed that when the electrolyte selected to anodize the remaining aluminum layer 16 forms dense alumina (e.g., electrolyte is citric acid), the growth of the tantalum pentoxide nano-pillars will push the remaining barrier layer B up through the pores 18, which may be the source of alumina traces in the resulting nano-pillars 20.

Figure 1D:
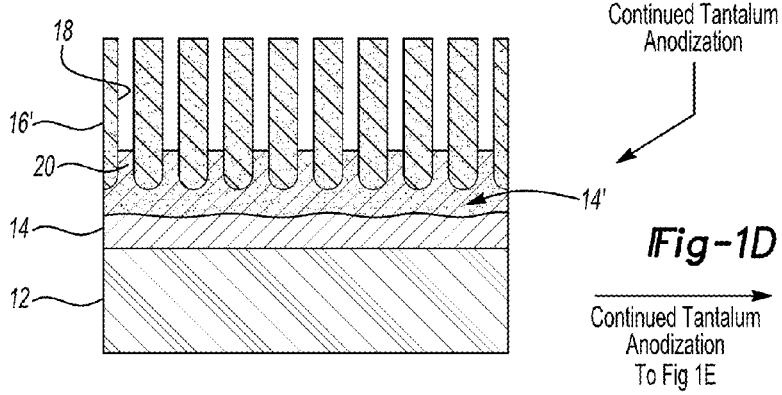

Whichever process and electrolyte is selected for tantalum layer 14 anodization, it is to be understood that as the anodization of the oxidizable material layer 14 (in this example the tantalum layer 14) continues, the oxidized form of the tantalum (i.e., tantalum pentoxide structure 14') grows through the individual pores 18 defined in the template 16' to form a nano-pillar 20 of tantalum pentoxide in each pore 18, as shown in FIGS. 1D and 1E. This structure 14' is grown from the tantalum layer 14, and some of the structure 14' grows through the pores 18 of the template 16'. The growing of the structure 14' may be accomplished, for example, by partially anodizing the tantalum layer 14 (i.e., part of the layer 14 is oxidized, and part of the layer 14 remains non-oxidized) as previously described. As anodization continues, both the interface between the oxidizable material layer 14 and the formed anodic oxide (i.e., oxide structure) 14' and the interface between the anodic oxide 14' and the electrolyte (not shown) are planarized. The effect of planarization at the interfaces is shown in FIG. 1E, and the planarization of the interface(s) will be described further hereinbelow in conjunction with the FIGS. 5, 6, 7, and 8 series.

The oxidized form of the tantalum formed during the anodization of the tantalum layer 14 is a substantially pure oxide. As used herein, a "substantially pure oxide" refers to an oxide that may include some impurities. Typically, dense oxides (such as the structure 14', 14") have a smaller amount of impurities as compared to porous oxides (such as the template 16'). In one embodiment, the dense oxide includes a small portion of the alumina (or other material forming the template 16') and/or of the electrolyte. In one embodiment, the porous alumina template 16' may have up to about 15 wt % or up to about 18 wt % of electrolyte ions incorporated and/or absorbed/adsorbed therein.

It is to be understood that the volume of the tantalum pentoxide that grows during the anodization of the tantalum layer 14 should exceed the volume of the tantalum from which the oxide is formed so that the oxide squeezes into the pores 18 of the template 16' to form the nano-pillars 20. The orientation of the nano-pillars 20 is generally controlled by the orientation of the pores 18. In the example of the method depicted in the FIG. 1 series, the nano-pillars 20 are oriented in a position that is substantially normal to the substrate 12, and thus is substantially normal to the non-anodized portion of the flat tantalum layer 14 disposed on the substrate 12.

As shown in FIG. 1E, the tantalum layer 14 is anodized at an appropriate anodization voltage and/or current density for an amount of time sufficient for the tantalum pentoxide nano-pillars 20 to grow, inside their respective pores 18, up to a predetermined height h. As soon as the nano-pillars 20 are grown to the predetermined height h (and thus each nano-pillar would have the same length L), anodization is stopped, and the multi-layered stack 10 is removed from the electrolytic cell.

Referring now to FIG. 1F, the method further includes selectively removing the template 16' from the multi-layered structure 10.

In an example, the template 16' is removed using a selective etching process that will remove the anodic alumina template 16' without deleteriously affecting the other features (e.g., 14', 20). Selective etching may be accomplished using an etchant solution (such as, e.g., $H_3PO_4$—$CrO_3$—$H_2O$) solution) at a temperature ranging from about 80° C. to about 95° C. It is to be understood that etching may also be accomplished at a temperature outside of the foregoing range, but the duration of the etching may be affected. For instance, at a temperature lower than 80° C., the duration of the etching may be longer. In some cases, etching may also be accomplished at temperatures as high as the boiling point of the solution (such as, e.g., about 100° C.). In this embodiment, $H_3PO_4$ etches the alumina and the $CrO_3$ passivates aluminum etching (this is particularly desirable when working with patterned aluminum and localized alumina). In one example, the etchant solution includes about 92 g of $H_3PO_4$, about 32 g of $CrO_3$, and about 200 g of $H_2O$, although it is to be understood that the components of the etchant may vary. It has been found that the nano-pillars 20 can withstand this particular etching process for more than one hour, while the anodic alumina template 16' is etched away at a rate of about 1 micron per minute. Other etching solutions that may be used include hydroxide solutions such as, e.g., NaOH, KOH, etc. The alumina template 16' may also be etched using a 5% $H_3PO_4$ solution at 30° C., $H_2SO_4$, etc. Etching may be accomplished, e.g., in a lateral direction to a distance of about 100 µm, and in some instances even further. The nano-structure 100 formed after removing the template 16' is shown in FIG. 1F, which includes one or more free-standing nano-pillars 20.

Figure 2B:
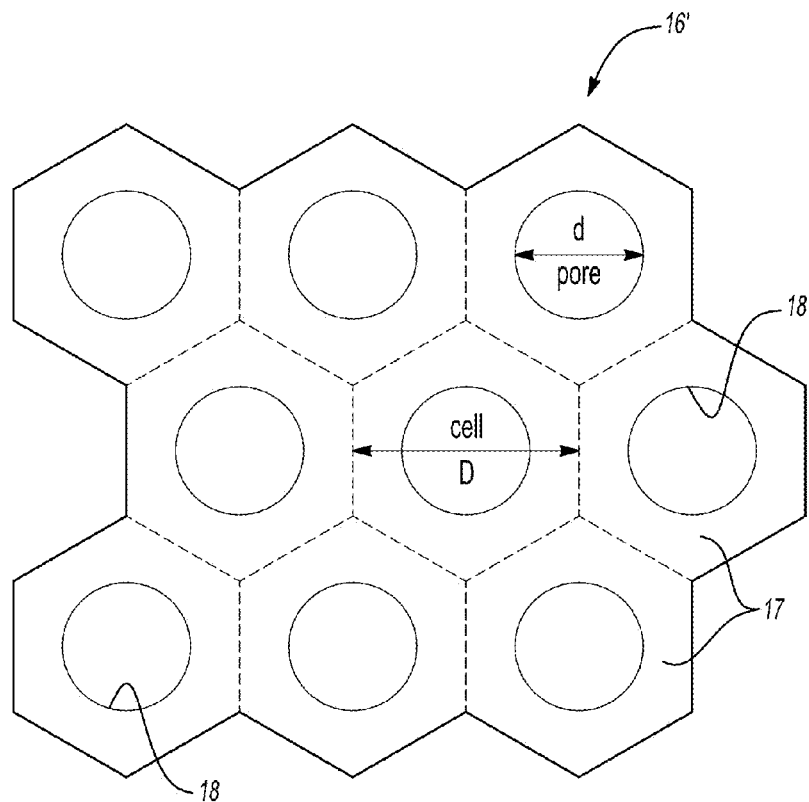
FIG. 2B is a top view of the example of the structure of FIG. 2A.
Figure 2C:
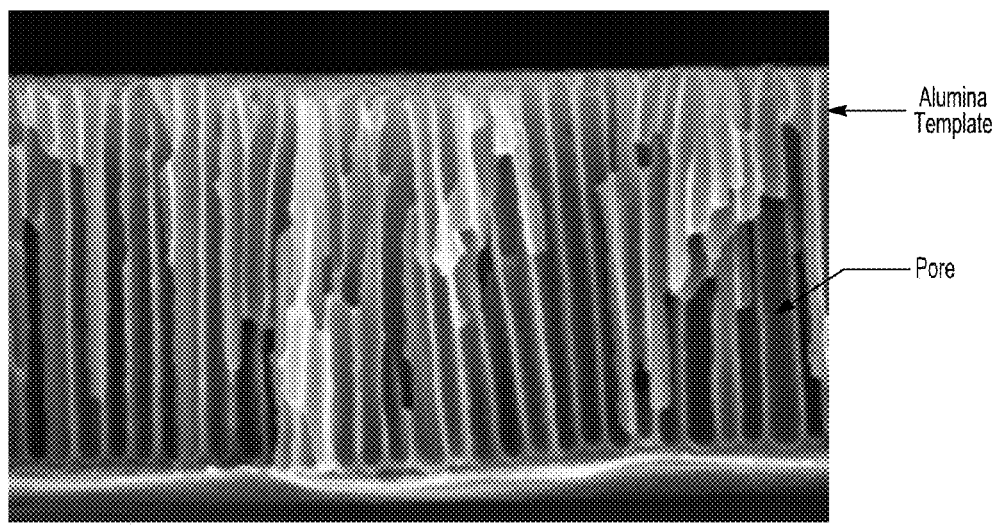
FIG. 2C is a scanning electron micrograph (SEM) image showing a cross section of an anodic alumina template after about 30 minutes of etching.

It is further to be understood that the configuration/structure of the pores 18 may also dictate the geometry and/or dimensions of the individual nano-pillars 20. For instance, the template 16' may be formed so that the pores 18 have a uniform diameter, a uniform pitch, and a uniform height. When the nano-pillars 20 grow during the anodization, the geometry and/or dimensions of the nano-pillars 20 will conform to that of the pores 18 within which the nano-pillars 20 are growing. The geometry and/or dimensions of the nano-pillars 20 may further be controlled by adjusting one or more parameters of the oxidizable material anodization process. For instance, as illustrated in FIG. 2B, the pitch D of the nano-pillars 20 (which is equivalent to the cell 17 diameter of the anodic alumina template 16') will depend on the anodization voltage of the anodization process used to form the template 16'. The diameter d of the nano-pillars 20 (which is equivalent to the pore 18 diameter) will depend on the nature of the electrolyte selected and the current density used during the anodization of the aluminum layer 16 to form the template 16'. The diameter d may also depend upon the degree of anisotropic etching used to further refine and define the pores 18. As mentioned above, the height h of the nano-pillars 20 and the dense underlying $Ta_2O_5$ layer 14' is proportional to the anodization voltage applied to the tantalum layer 14 during its anodization. Other factors that affect the height of the nano-pillars 20 and the dense underlying $Ta_2O_5$ layer 14' include the duration of anodization at the anodization voltage, pore diameter, and possibly one or more other factors. As mentioned above, for growing a dense tantalum pentoxide film, about 1.8 nm of the oxide grows per one volt, and for growing nano-pillars with a dense underlying tantalum pentoxide layer, from about 1.3 nm to about 1.8 nm of the oxide grows per one volt. Other dimensions that may be derived from the pitch D, the diameter d, and the height h include the gap between the nano-pillars 20 (i.e., D–d=gap) and the aspect ratio (i.e., h/d=aspect ratio) of the nano-pillars 20. In an example, the nano-pillars 20 have i) a pitch D ranging from about 30 nm to about 500 nm, ii) a diameter d ranging from about 10 nm to about 350 nm, and iii) a height h ranging from greater than 10 nm to about 1000 nm. In another example, the gap between adjacent nano-pillars 20 ranges from about 0 nm (i.e., where the nano-pillars 20 physically touch each other) to about 300 nm. It is to be understood that the dimensions disclosed herein may be suitable for alumina templates and $Ta_2O_5$ structures (e.g., layer 14", nano-pillars 20 and 20'), and that the ranges for the various dimensions may vary when other materials are utilized.

Figure 4A:
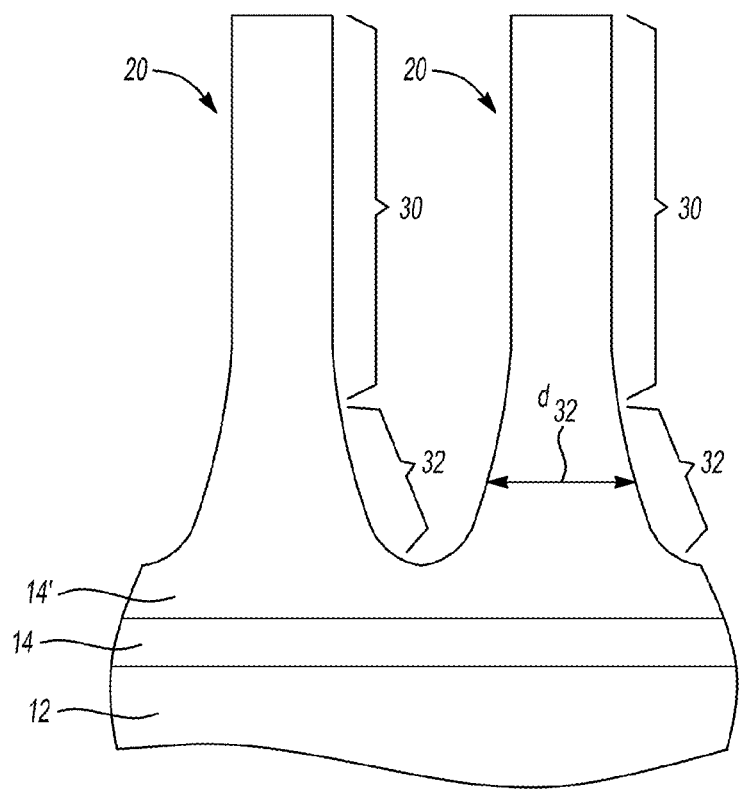
FIG. 4A is a schematic illustration of two nano-pillars of a nano-structure formed by the method shown in FIGS. 1A through 1F, where each of the nano-pillars includes a cone-shaped portion and a cylindrical-shaped portion.
Figure 4B:
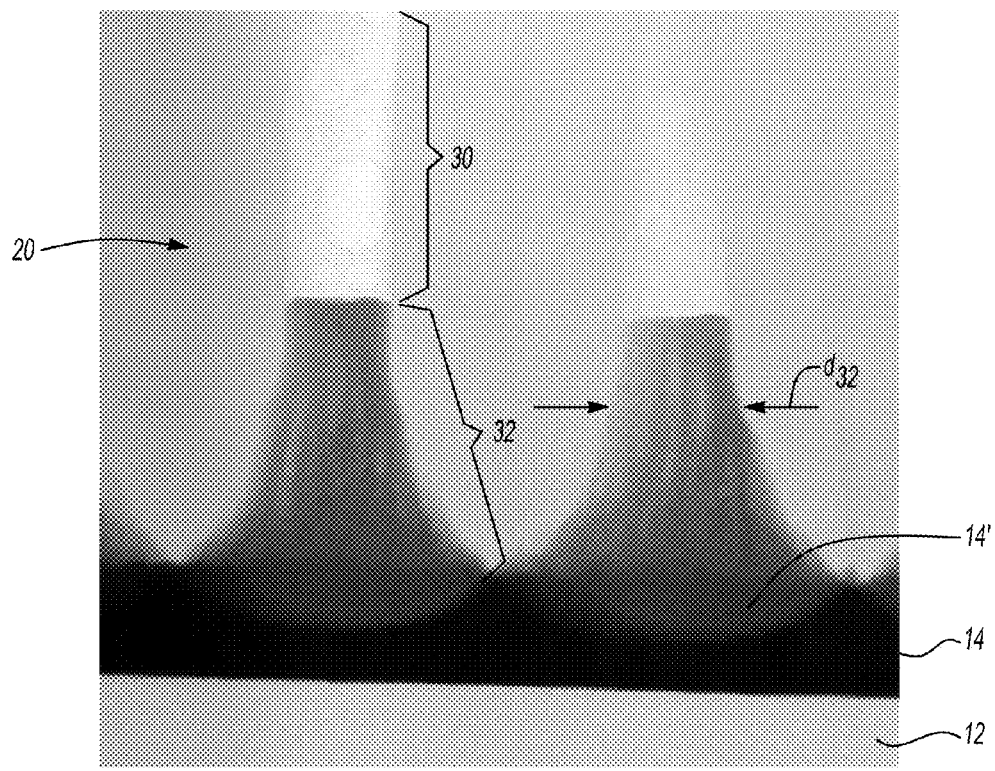
FIG. 4B is a transmission electron micrograph (TEM) image of two nano-pillars that are similar to those shown in FIG. 4A.
Figure 4C:
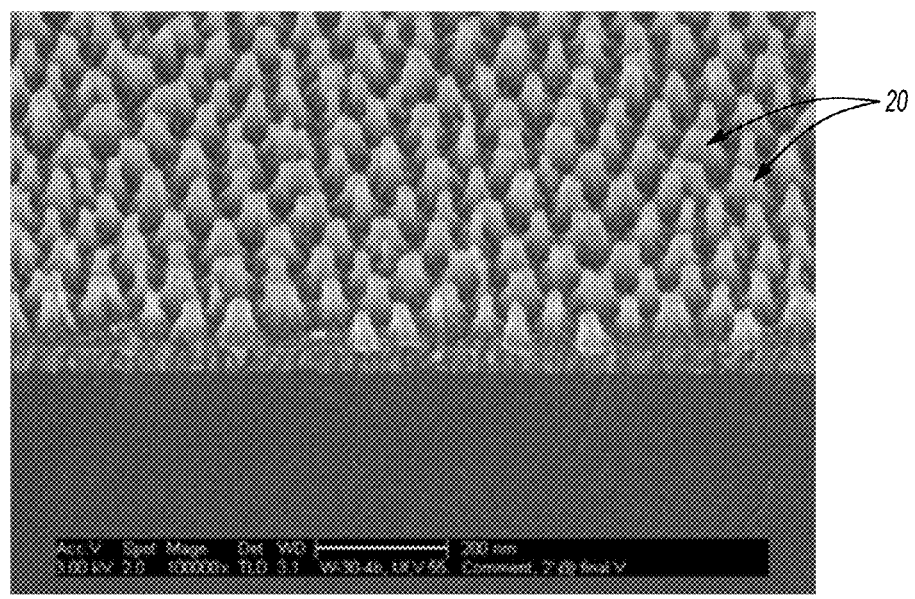
FIG. 4C is a SEM image of a nano-structure including an array of the nano-pillars depicted in FIG. 4B.

While the nano-pillars 20 may be formed having a substantially uniform geometry based, at least in part, on the configuration/structure of the pores 18, in many cases, the anodization of the tantalum layer 14 forms nano-pillars having an imperfect cylindrical shape (i.e., one or more non-uniform diameters along the height, e.g., the nano-pillars 20 shown in FIG. 1F). For instance, a nano-pillar having an imperfect cylindrical shape includes one having a bottom portion 32 that is substantially cone-shaped and a top portion 30 that is substantially cylindrical-shaped. This is shown schematically in FIG. 4A and in the TEM and SEM images depicted in FIGS. 4B and 4C, respectively. As shown more particularly in FIGS. 4A and 4B, the diameter $d_{32}$ of the bottom portion 32 of each nano-pillar 20 also generally increases (as one approaches the layers 14' and 14) until adjacent nano-pillars 20 touch each other. As previously mentioned, the largest diameter of the bottom portion 32 is about 3*d. Due, at least in part, to the non-uniform nano-pillar shape, it may, in some instances, be difficult to control the surface chemistry, and thus particular optical properties of the nano-pillar 20.

To obtain nano-pillars 20' having a more perfect cylindrical shape (i.e., nano-pillars having a uniform diameter along the height, e.g., those identified by reference numeral 20' shown in FIG. 1G), in an embodiment, the tantalum layer 14 is further anodized at an interface I (see FIG. 1F) between the tantalum layer 14 and the oxidized structure 14'. This additional anodization step will form the oxidized structure 14″, which eliminates the cone-shaped portion 32 of the nano-pillars 20, leaving nano-pillars 20′. This additional anodization step involves applying an appropriate current and voltage for an amount of time (e.g., from about 5 minutes to about 15 minutes) sufficient to consume the cone-shaped portion (e.g., the bottom portion 32 shown in FIGS. 4A and 4B) of the nano-pillars 20. As mentioned above, the thickness of layer 14″ may be calculated as follows: thickness of layer 14″=1.8 nm×anodization voltage at the final step, and the anodization voltage at the final step may be calculated by: 2d*2.7/1.8. As such, for the nano-pillars 20 having a diameter of 30 nm, the thickness of the layer 14 to be grown is 1.8*(2*30*2.7/1.8) =162 nm and the voltage at the final step to achieve this thickness is 162/1.8=2*30*2.7/1.8=90 V. In an example, anodization at the interface I is accomplished using the same anodization process(es) described above for the anodization of the tantalum layer 14. In one example, anodization at the interface I is accomplished using a 0.1% citric acid electrolyte, and a voltage that is applied in steps from about 20 V to about 200 V. In yet another example, anodization is accomplished by applying a voltage in steps from about 50 V to about 150 V. In still another example, a standard galvanostatic regime may be used where anodization is performed at constant current density up to the desired voltage (to achieve the desired thickness of layer 14″), and then remain this voltage for a time ranging from about 5 minutes to about 15 minutes to complete the anodization. In any of the embodiments disclosed herein, the duration of anodization at this final voltage may be as long as about 30 minutes.

Figure 5A:
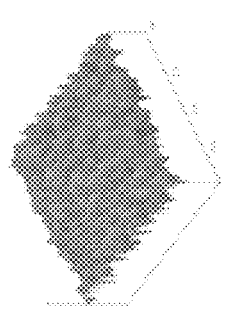
FIGS. 5A through 5E are atomic force microscopy (AFM) three dimensional images of a surface with increasing $Ta_2O_5$ thickness from 0 nm (i.e., initial Ta surface with no oxide formed) to about 360 nm, all images have the same Z scale of 50 nm and the same X-Y area of $2\times2$ $\mu m^2$.
Figure 5B:
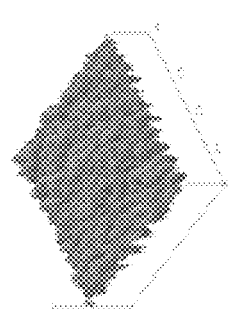
Figure 5C:
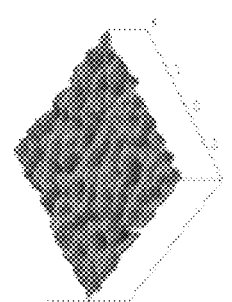
Figure 5D:
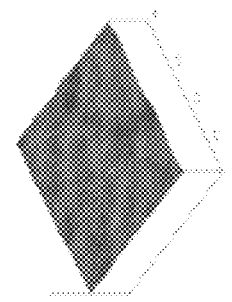
Figure 5E:
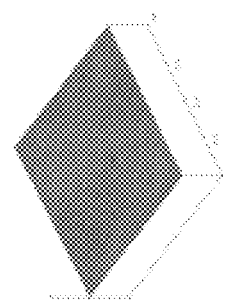
Figure 6A:
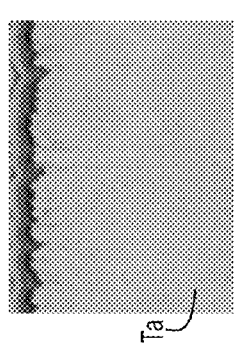
FIGS. 6A through 6E are SEM images of a cross-section of a portion of a nano-structure showing, in sequence, a planarization effect at an interface formed between tantalum and tantalum pentoxide.
Figure 6B:
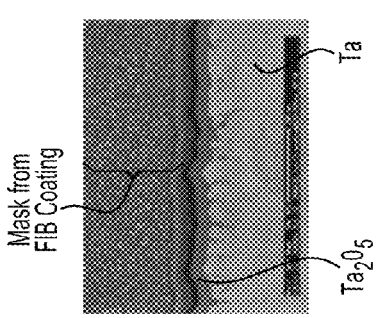
Figure 6C:
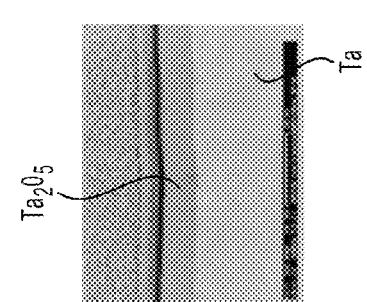
Figure 6D:
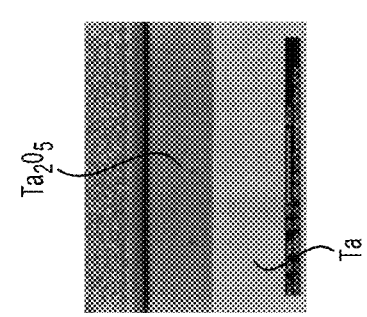
Figure 6E:
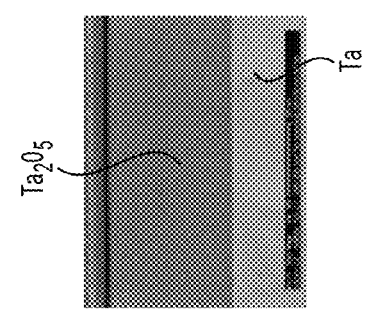

Without being bound to any theory, it is believed that the cone-shaped bottom portion 32 of the nano-pillars 20 is consumed by further growth of the tantalum pentoxide due, at least in part, to a planarization effect. During this stage of anodization, it is believed that the thinnest portion (in terms of height) of the $Ta_2O_5$ will continue to be oxidized. As such, the anodization occurs between the nano-pillars 20. For instance, once the nano-structure 100 is formed (see FIG. 1F), the oxide structure/layer 14′ may be subjected to further anodization to further planarize or otherwise smooth the layer 14′ at the interface I between the tantalum layer 14 and the tantalum pentoxide layer 14′, to form tantalum pentoxide layer 14″. Planarization may be accomplished, for example, by increasing the voltage throughout this additional anodization of the tantalum layer 14 at the interface I and then holding the final voltage for a suitable time to consume the cone-shaped portion 32. An illustration of the planarization effect through anodization is shown in the images set forth in FIGS. 5A through 5E and FIGS. 6A through 6E. FIGS. 5A through 5E are AFM three-dimensional images illustrating the change in surface roughness as the thickness of $Ta_2O_5$ increases, and FIGS. 6A through 6E illustrate the planarization effect at the interface between tantalum and $Ta_2O_5$ as the thickness of $Ta_2O_5$ increases. FIGS. 5A and 6A show a relatively non-planar exposed surface of a tantalum layer 14 after sputtering. Anodization is initiated to grow the tantalum pentoxide as shown in FIGS. 5B and 6B, and then the anodization voltage is increased stepwise from about 20 V (shown in FIGS. 5B and 6B) up to about 200 V (shown in FIGS. 5E and 6E). The increase in the anodization voltage allows the tantalum pentoxide layer to grow in opposed directions (as shown in sequence from FIGS. 6B through 6E), thereby consuming more of the tantalum and flattening or planarizing the $Ta_2O_5$ surface (as shown in sequence from FIGS. 5B to 5E) and the interface I between the remaining tantalum and the $Ta_2O_5$ (as shown in sequence from FIGS. 6B through 6E).

Figure 7A:
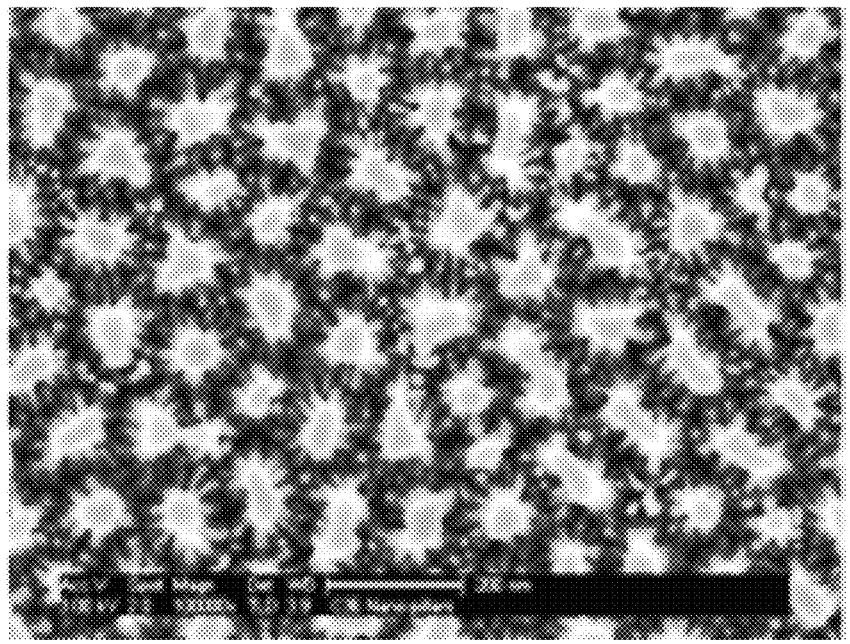
FIGS. 7A through 7D are SEM images of a top view of a nano-structure including an array of nano-pillars, where
Figure 7B:
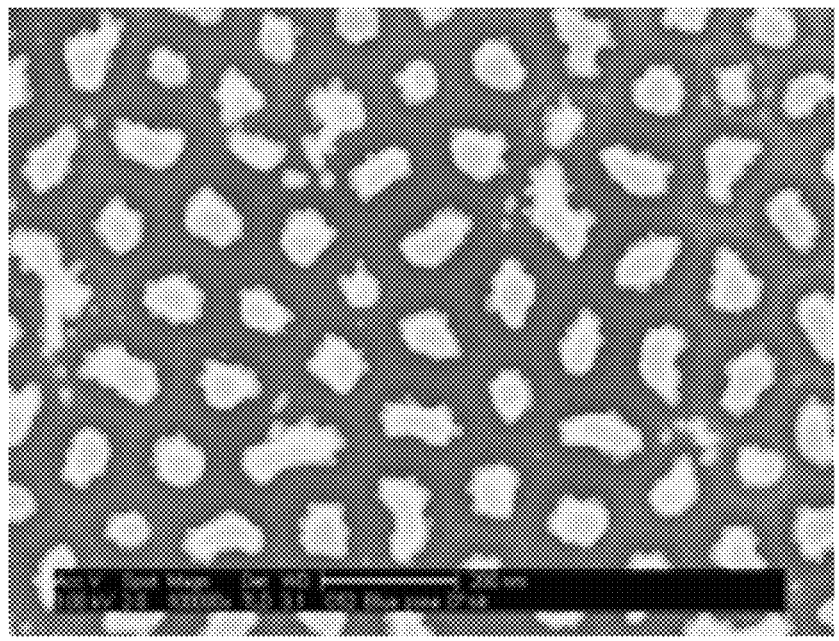
Figure 7C:
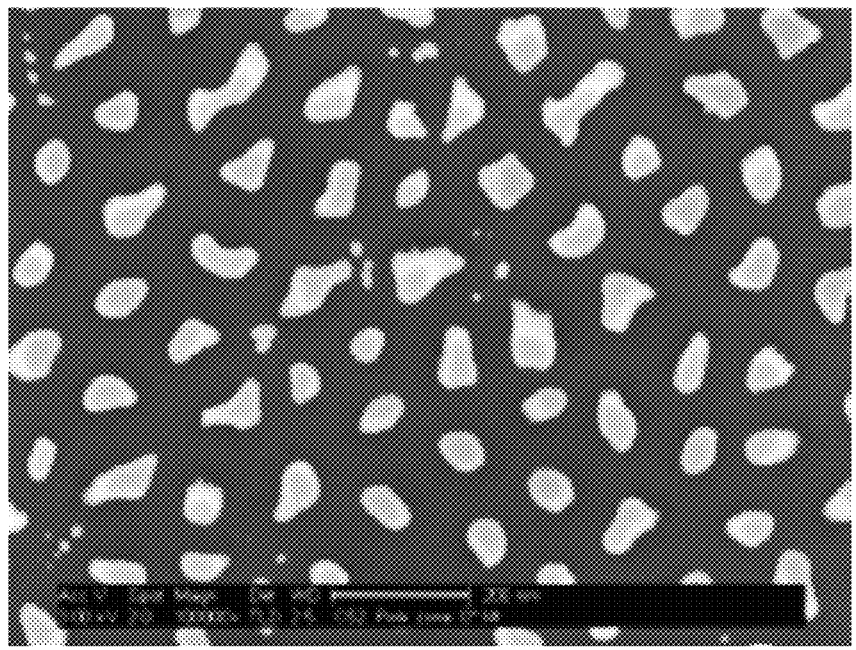
Figure 7D:
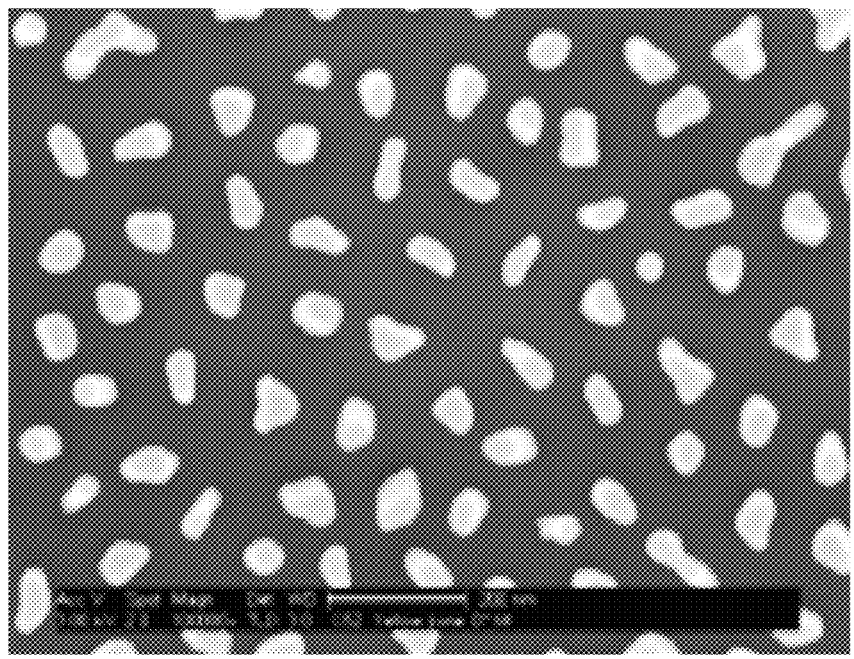
Figure 8A:
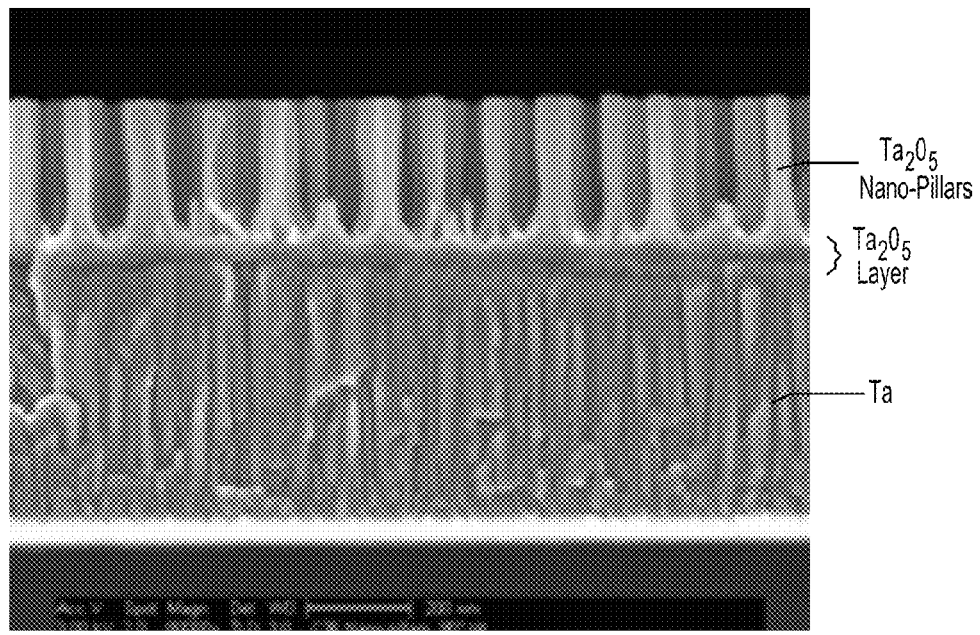
FIGS. 8A through 8D are SEM images of a cross-section of the nano-structure depicted in FIGS. 7A through 7D, respectively.
Figure 8B:
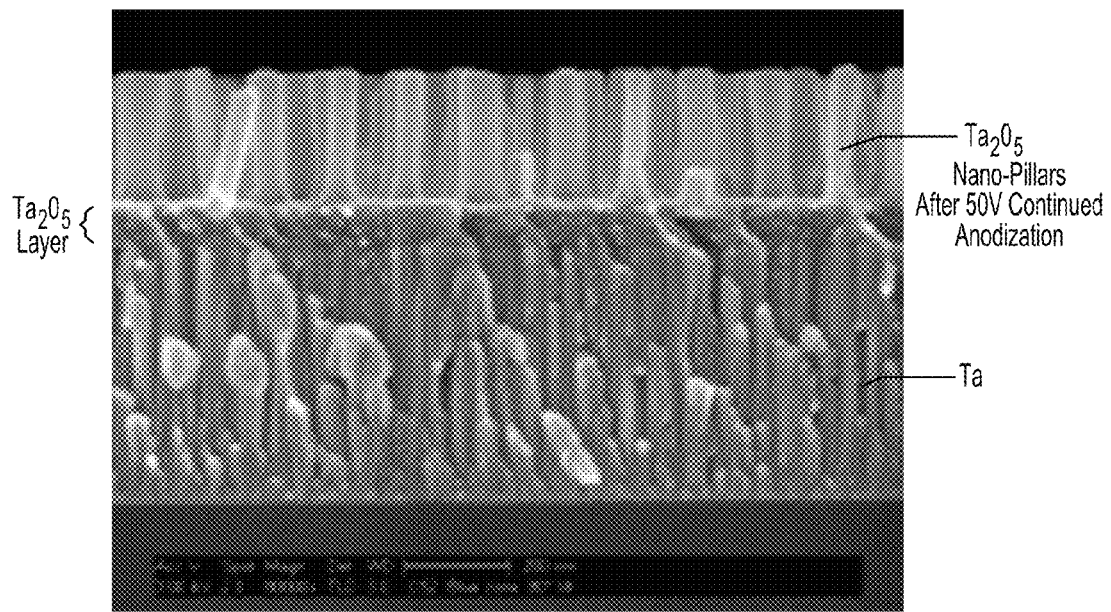
Figure 8C:
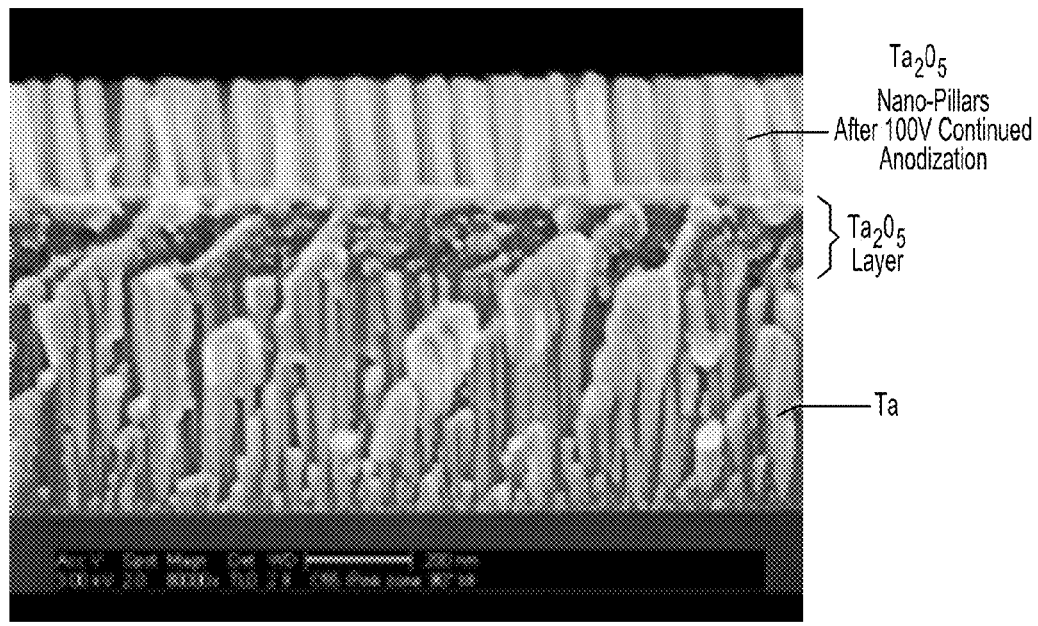
Figure 8D:
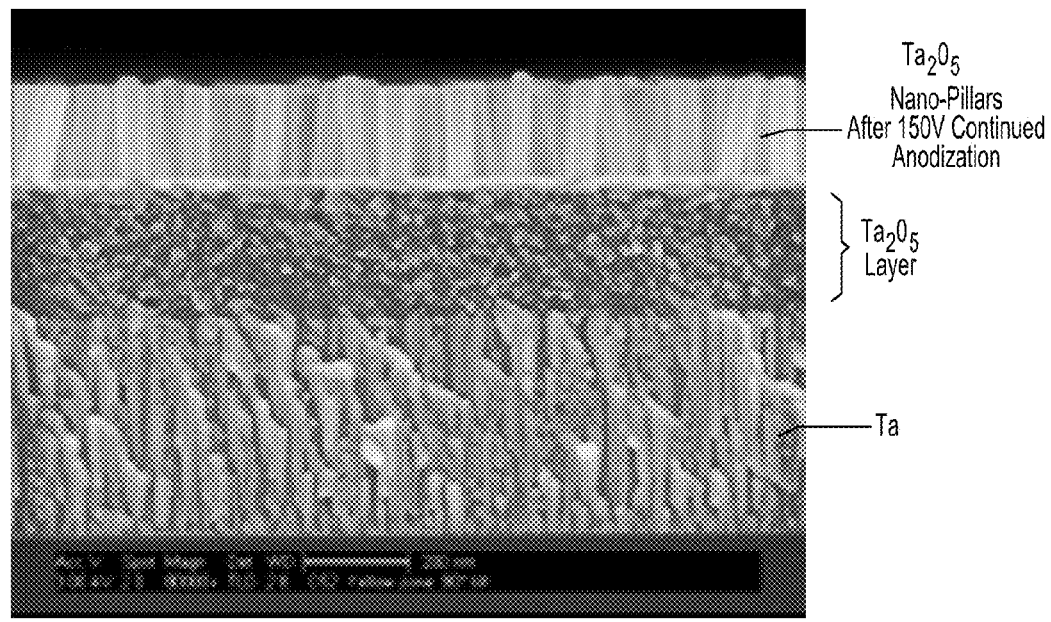
Figure 8E:
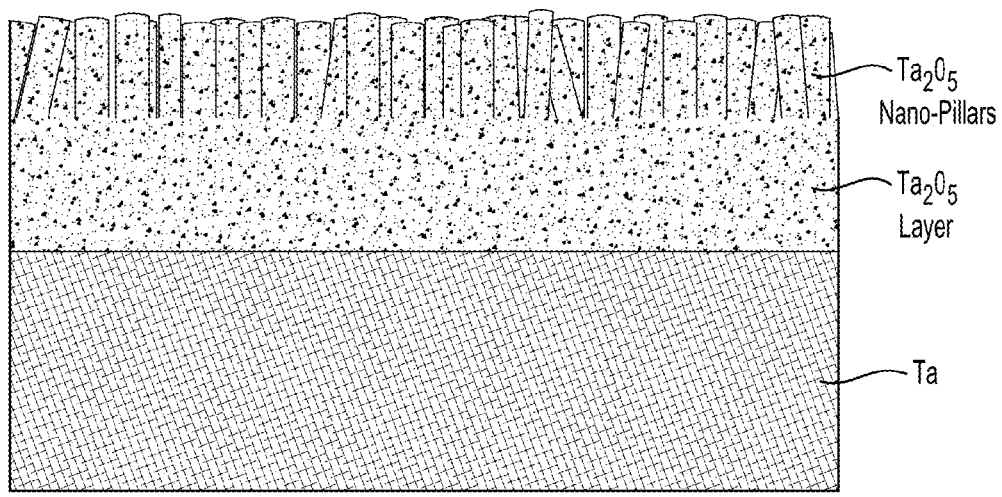
FIG. 8E is a schematic illustration of the nano-structure of FIG. 8D.

An example of the planarization effect is also shown in FIGS. 7A through 7D and in FIGS. 8A through 8D, respectively. FIGS. 7A and 8A respectively depict top and cross-sectional images of a nano-structure including nano-pillars having the cone-shaped bottom portion. Throughout the additional anodization process, the anodization voltage is increased from about 50 V up to about 170 V, and when the voltage is held at 170 V until a steady state value is achieved, the cone-shaped bottom portion is consumed to form the cylindrical nano-pillars depicted in FIGS. 7D and 8D. As illustrated in FIG. 7D, the perimeters of the cylindrical nano-pillars are not perfectly round, but rather have a variety of shapes. It is to be understood that the diameter of these nano-pillars may not be the same around the perimeter, but rather any one diameter of the nano-pillar is substantially the same at the top of that nano-pillar, through its height, and at the bottom of that nano-pillar. FIG. 8E is a schematic illustration of the cylindrical nano-pillars 20′ formed in FIG. 8D.

The nano-pillars 20′ formed as a result of the additional anodization process are shown in FIG. 1G.

Figure 9:
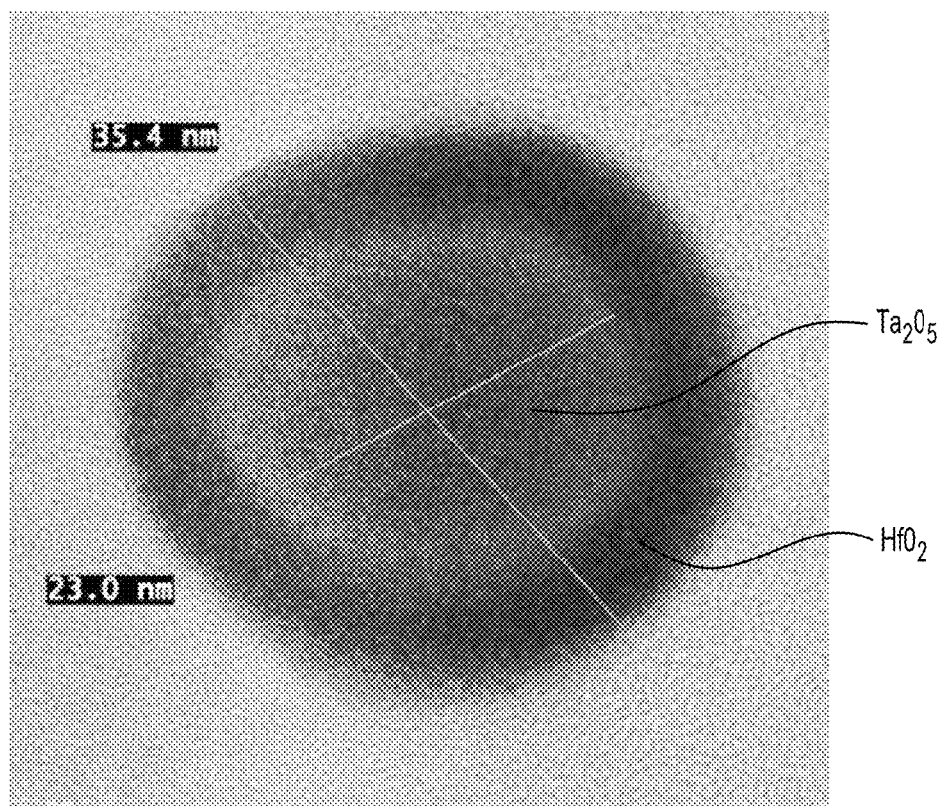
FIG. 9 is a TEM image of a cross-section of a $Ta_2O_5$ nano-pillar coated with a material layer, specifically $HfO_2$.

As mentioned above, the optical properties of the now substantially cylindrical-shaped nano-pillars 20′ (or nano-cylinders 20′) may be controlled depending, at least in part, on the application for which the nano-structure 100′ may be used. In an example, the optical properties may be controlled by coating the nano-cylinders 20′ with a material to form a layer thereon, where such material layer, e.g., imparts one or more desired optical properties to the nano-cylinders 20′. In some cases, the material layer may also be used to improve the chemical robustness of the nano-structure 100′, to tune the contact angle of the coated surfaces in order to improve wettability or to stop wetting, to change the acidity or zeta potential of the surfaces so that the surfaces may have a different affinity to different chemicals, etc. Some examples of materials include aluminum oxide, zirconium oxide, titanium oxide, silicon dioxide, tungsten oxide, zinc oxide, hafnium oxide, and combinations thereof. An example of a coated nano-pillar is shown in the TEM image shown in FIG. 9. In this example, a tantalum pentoxide ($Ta_2O_5$) nano-pillar is coated with a layer of hafnium oxide ($HfO_2$). Coating may be accomplished using an atomic layer deposition technique without having to use an adhesion layer. It is to be understood, however, that other coating techniques may otherwise be employed, some of which may or may not require deposition of an adhesion layer to suitably adhere the material to the nano-pillar. Some examples of the other deposition techniques include chemical vapor deposition, metal organic chemical vapor deposition (MOCVD), electrochemical deposition, and/or the like. In an example, the material may be conformally deposited over the entire surface of the selected nano-pillars 20′ at a thickness ranging from about 4 nm to about 8 nm. In another example, the thickness of the deposited layer is about 6 nm.

While several embodiments have been described in detail, it will be apparent to those skilled in the art that the disclosed embodiments may be modified. Therefore, the foregoing description is to be considered non-limiting.

What is claimed is:

1. A method of forming a nano-structure, comprising:
   forming a multi-layered structure including i) an oxidizable material layer established on a substrate, and ii) an other oxidizable material layer established on the oxidizable material layer, the oxidizable material layer being formed of an oxidizable material having an expansion coefficient, during oxidation, that is more than 1;

forming a template having pores therein by anodizing the other oxidizable material layer to form a porous anodic structure;

anodizing the oxidizable material layer to form a dense oxidized layer, and nano-pillars which grow through the template into the template pores;

selectively removing the entire template to expose the nano-pillars; and then anodizing a surface between the dense oxidized layer and a remaining portion of the oxidizable material layer to consume a substantially cone-shaped portion of the nano-pillars, thereby forming cylindrical nano-pillars.

2. The method as defined in claim 1 wherein the anodizing of the surface between the dense oxide layer and the remaining portion of the oxidizable material layer planarizes the dense oxide layer.

3. The method as defined in claim 2 wherein the anodizing of the surface between the dense oxide layer and the remaining portion of the oxidizable material layer is accomplished using 0.1% citric acid and a voltage ranging from about 20 V to about 200 V.

4. The method as defined in claim 1 wherein the anodization of the other oxidizable material layer is accomplished using an electrolyte chosen from $H_2SO_4$, $H_3PO_4$, $H_2C_2O_4$, $H_2CrO_4$ and mixtures thereof.

5. The method as defined in claim 1 wherein the anodization of the oxidizable material layer is accomplished using an electrolyte chosen from $C_6H_8O_7$, $H_3BO_3$, $(NH_4)_2B_{10}O_{16} \times 8H_2O$, $H_4NO_2CCH(OH)CH(OH)CO_2NH_4$, and mixtures thereof.

6. The method as defined in claim 1 wherein the anodization of the other oxidizable material layer and the anodization of the oxidizable material layer are accomplished using any of $H_2SO_4$, $H_3PO_4$, $H_2C_2O_4$, $H_2CrO_4$ and mixtures thereof as an electrolyte.

7. The method as defined in claim 1 wherein selectively removing the entire template is accomplished via a selective etching process.

8. The method as defined in claim 1, further comprising coating the cylindrical nano-pillars with a material chosen from aluminum oxide, zirconium oxide, titanium dioxide, silicon dioxide, tungsten oxide, zinc oxide, hafnium oxide, and combinations thereof.

9. The method as defined in claim 1, further comprising selecting aluminum as the other oxidizable material layer and tantalum as the oxidizable material layer.

10. The method as defined in claim 1 wherein each of the anodization processes is accomplished via electrochemical oxidation.

11. The method as defined in claim 1 wherein the template does not extend into the oxidizable material layer.

12. The method as defined in claim 1 wherein the substrate is glass, quartz, alumina, stainless steel, plastic, or a combination thereof.

* * * * *